United States Patent [19]
Usami

[11] Patent Number: 5,499,210
[45] Date of Patent: Mar. 12, 1996

[54] LOW POWER CONSUMPTION SEMICONDUCTOR MEMORY

[75] Inventor: Tadashi Usami, Hino, Japan

[73] Assignee: Motorola, Inc., Schaumburg, Ill.

[21] Appl. No.: 402,457

[22] Filed: Mar. 10, 1995

[30] Foreign Application Priority Data

Mar. 16, 1994 [JP] Japan .................................. 6-045848

[51] Int. Cl.⁶ ........................................... G11C 7/00
[52] U.S. Cl. ................... 365/190; 365/189.08; 365/202; 365/227
[58] Field of Search .............................. 365/190, 205, 365/189.08, 189.01, 227, 202

[56] References Cited

U.S. PATENT DOCUMENTS 4,922,461  5/1990  Hayakawa et al. ............... 365/189.08
5,010,521  4/1991  Matsui .................................. 365/190

Primary Examiner—Tan T. Nguyen
Attorney, Agent, or Firm—Robert D. Atkins; Masanori Hono

[57] ABSTRACT

A low power consumption semiconductor memory device that can read stored data at a faster access time, while minimizing power consumption is provided. In accordance with the logic states on a pair of bit lines on which an information signal stored in the memory cell and an inverted version of that information signal are placed, it is detected that the information signal is placed onto the bit line, and then the information signal on that bit line is read onto the data signal bus.

4 Claims, 3 Drawing Sheets

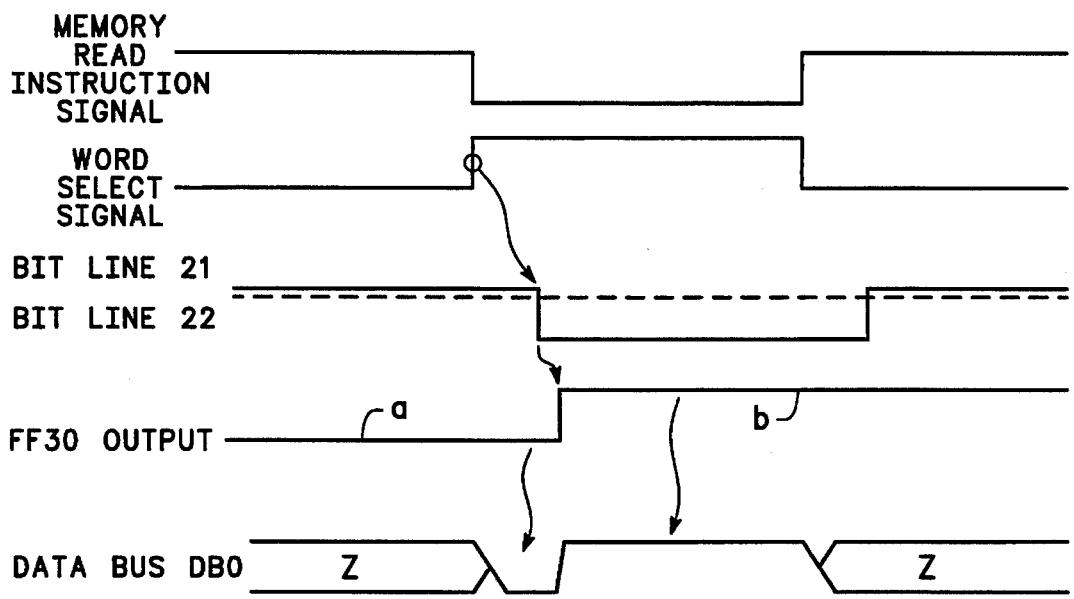
FIG. 2 -PRIOR ART-
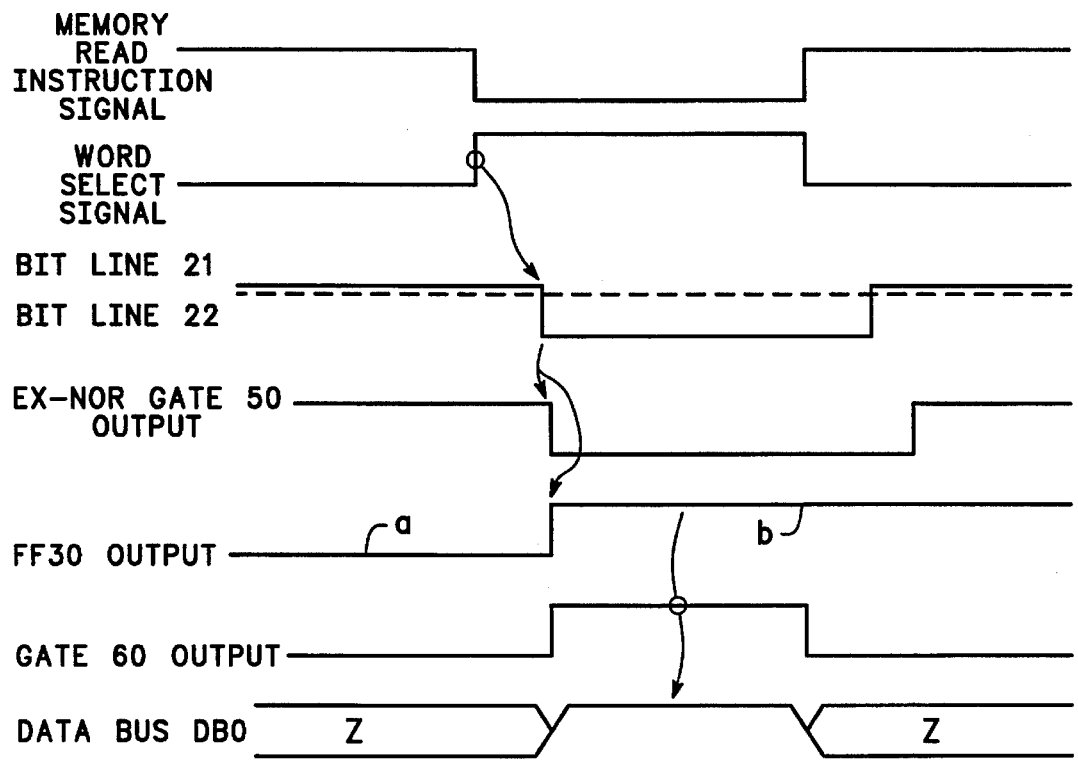
FIG. 4

LOW POWER CONSUMPTION SEMICONDUCTOR MEMORY

TECHNICAL FIELD

The present invention relates to semiconductor memory devices.

BACKGROUND

FIG. 1 shows one example of an SRAM (static random access memory) as a prior art semiconductor memory device.

In FIG. 1, an address decoder 1 generates a word select signal corresponding to an address signal and supplies it to each of memory blocks 10(0)-(n) via a word line 20.

Each of the memory blocks 10(0)-(n) is a memory block of the same configuration, which is formed corresponding to each bit of data signal buses DB0-n.

An internal configuration of the memory block is described below in connection with an example of memory block 10(0).

In the figure, in memory block 10(0), there are provided a number of memory cells for storing one bit of information signal, corresponding to the number, m, of words stored. Each of these memory cells 100 is comprised of inverters 101 and 102 for storing one bit of information signal, a transmission gate 103 for transmitting the output of the inverter 102 to a bit line 21 in response to the word select signal, and a transmission gate 104 for transmitting the output of the inverter 101 to a bit line 22 in response to the word select signal.

Within m memory cells 100(1)-(m), only a memory cell to which a logic "1" word select signal is supplied from the address decoder 1 is accessed. Then, the accessed memory cell sends its stored information signal to the bit line 21 via the transmission gate 103. Furthermore, the accessed memory cell sends an inverted version of the stored information signal to the bit line 22 via the transmission gate 104. If a logic "1" word signal is not supplied to any of the memory cells 100(1)-(m), a precharge circuit (not shown) is activated. This precharge circuit forcefully charges the bit lines 21 and 22 to a logic "1" state.

A FF (flipflop) 30 formed of gates 31 and 33 rapidly determines the read result in accordance with the logic value of a pair of signal lines, such as the afore-mentioned bit lines 21 and 22. When the signal logic state on the bit line 21 is a logic "1" and the signal logic state on the bit line 22 is a logic "0" the FF 30 supplies a logic "0" information signal to the data bus driver 40 in response thereto. When the signal logic state on the bit line 21 is a logic "0" and the signal logic state on the bit line 22 is a logic "1", the FF 30 supplies a logic "1" information signal to the data bus driver 40 in response thereto. When the bit lines 21 and 22 are both in the logic "1" state due to the afore-described precharge circuit operation, the logic state of the information signal supplied to the data bus driver 40 prior to that state is held, while it is supplied to the data bus driver 40.

The data bus driver 40 is rendered into an output enable state when a logic "0" memory read instruction signal is supplied to its inverting output control terminal a. Furthermore, the data bus driver 40 is rendered into an output enable state when a logic "0" memory read instruction signal is supplied via the inverter 41 to its output control terminal b. That is, the data bus driver 40 is rendered into the output enable state depending on the supply of the logic "0" memory read instruction signal. Due to such an output enable state, the data bus driver 40 generates a voltage corresponding to the signal logic value of one bit of information signal stored in the FF 30 and applies it to the data signal bus DB0, whereas if the memory read instruction signal is not supplied, it is rendered into an output disable state. Thus, the data signal bus DB0 is then rendered into a so-called high-impedance state.

As described above, with the above configuration, in response to a logic "1" word select signal, the information signal stored in the memory cell is sent onto the bit line, and a memory read instruction signal is further supplied, so that the information signal on that bit line is read onto the data bus.

With the SRAM so configured, one possible method for reading stored data at a faster access time is to make the supply timing of the word select signal coincide with that of the memory read instruction signal.

FIG. 2 shows one example of operational timing chart where the stored data is read at such a timing.

In this figure, FF 30 stores a logic "0" information signal a as an initial value and outputs it as appropriate. It is also assumed that the memory cell 100 prestores a logic "0" information signal.

First, because the word select signal is in a logic "0" state, the bit line 21 (denoted by a solid line) and bit line 22 (denoted by a dotted line) are both in a logic "1" state, due to the operation of the afore-described precharge circuit. Furthermore, because the memory read instruction signal is a logic "1", the data signal bus DB0 is in a high-impedance state Z.

Next, when the word select signal becomes a logic "1", the logic "0" information signal stored in the memory cell 100 is sent onto the bit line 21 in response thereto. Also, to the bit line 22 is sent a logic "1" signal, or an inverted version of that information signal. Then, until the information signal stored in the memory cell 100 is sent to the bit lines 21 and 22 from a transition point where the word select signal is rendered into a logic "1", a delay is introduced as shown in FIG. 2, due to the influence of component capacitance, length of wiring and the like. After such delay, when the logic values of the bit lines 21 and 22 become "0" and "1", respectively, then the FF 30 outputs a logic "1" information signal b corresponding thereto. Then, concurrent with the afore-described transition of the word select signal to a logic "1" state, a logic "0" memory read instruction signal is supplied. In response to that memory read instruction signal, the data bus driver 40 is rendered into an output enable state. This output enable state causes the data bus driver 40 to generate a voltage corresponding to the logic value of the information signal supplied from the FF 30, and applies it to the data signal bus DB0. During that time, a delay as shown in the figure is present until the information signal b stored in the memory cell 100 is sent onto the bit lines 21 and 22. Thus, although the data bus driver 40 is in the output enable state in response to the memory read instruction signal, the FF 30 cannot immediately supply the information signal b to the data bus driver 40, during which time the information signal a is supplied to the data bus driver 40.

Thus, to read not only the information signal b read from the memory cell 100 but also the information signal a onto the data signal bus DB0, the data bus driver 40 generates a voltage corresponding to that information signal a and applies it to the data signal bus DB0, resulting in wasted power.

To cope with that, one conceivable method is to use a delay circuit to delay the timing of the memory read instruction signal supplied to the data bus driver 40, thereby preventing the aforementioned information signal a from being read onto the data bus. However, since the delay value of such a delay circuit is set somewhat greater in consideration of various factors, such as production process variations, supply voltage fluctuations, ambient temperature, it is difficult to reduce the access time associated with that method.

Accordingly, it is an object of the present invention to provide a low power consumption semiconductor memory device that permits reading of stored data at a faster access time, while minimizing power consumption.

SUMMARY OF THE INVENTION

A low power consumption semiconductor memory device according to the present invention comprises: a memory cell where an information signal is stored; a pair of bit lines on which the information signal stored in said memory cell and an inverted version of said information signal are placed; an information signal sense means for detecting when said information signal is placed onto said bit line in accordance with the logic value of each of said bit lines and generating an information sense signal; and an information reading means, responsive to said information sense signal, for reading the information signal on said bit line onto a data signal bus.

The low power consumption semiconductor memory cell according to the present invention detects when an information signal is placed onto a bit line in accordance with the logic state on a pair of bit lines where the information signal stored in the memory cell and an inverted version of that information signal are placed and reads the information signal on the bit line onto the data signal bus.

BRIEF DESCRIPTION OF THE DRAWINGS

FIG. 2 shows a timing chart for depicting the data reading operation of the prior SRAM.

FIG. 4 shows a timing chart for depicting the data reading operation of the low power consumption semiconductor memory device of the present invention.

DETAILED DESCRIPTION OF THE PREFERRED EMBODIMENT

Figure 1:
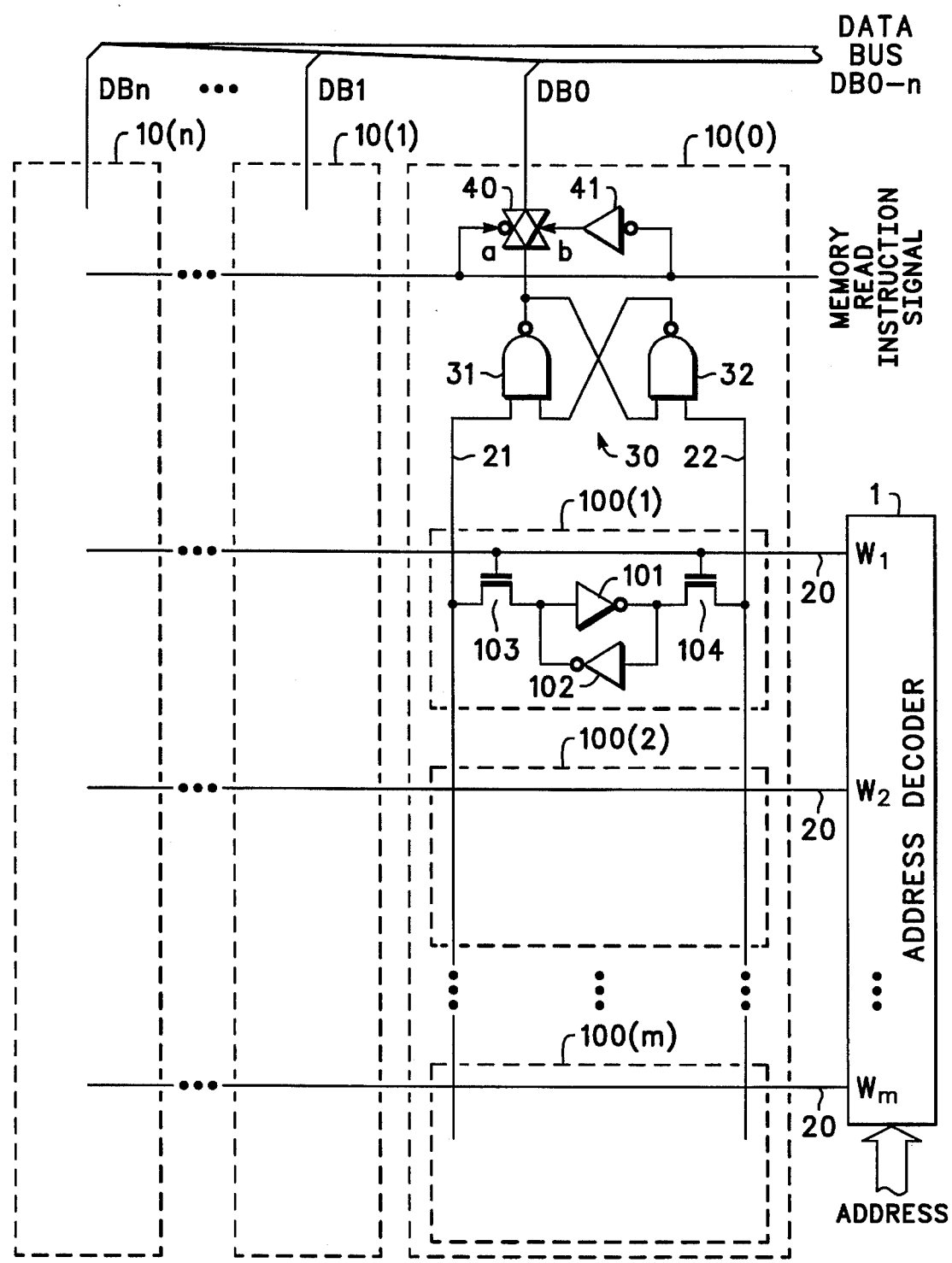
FIG. 1 shows one example of a prior SRAM configuration.
Figure 3:
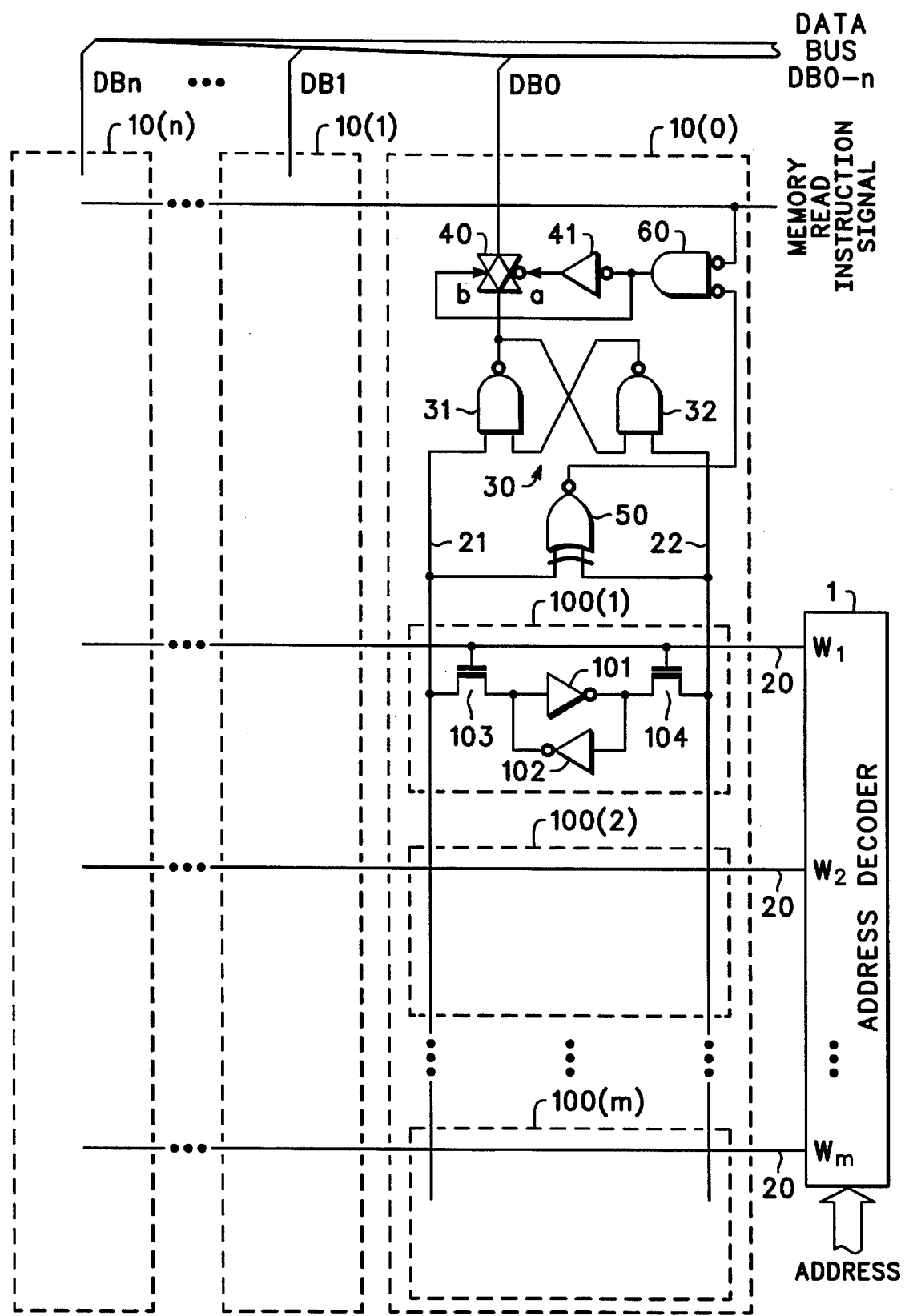
FIG. 3 shows one example of a low power consumption semiconductor memory device according to the present invention.

FIG. 3 shows one example of an SRAM configuration as a low power consumption semiconductor memory device according to the present invention.

In FIG. 3, an address decoder 1 generates a word select signal corresponding to an address signal and supplies it to each of the memory blocks 10(0)-(n) via a word line 20.

Each of these memory blocks 10(0)-(n) is a memory block of the same configuration, and is formed corresponding to each bit of data signal buses DB0-n.

In connection with memory block 10 (n) as an example, the internal structure of this memory block is described below.

In FIG. 3, in the memory block 10(0), a number of memory cells 100 for storing one bit of information signal are provided corresponding to the number, m, of words stored. Each of these memory cells 100 is comprised of inverters 101 and 102 for storing such information signals, and transmission gates 103 and 104, responsive to the word select signal, for transmitting the outputs of the inverters 102 and 103, respectively, onto bit lines 21 and 22 as stored information leader lines, respectively.

Within these m memory cells 100(1)-(m), only a memory cell to which a logic "1" word select signal is supplied from the address decoder 1 is accessed. Then, the accessed memory cell sends its stored information signal to the bit line 21 via the transmission gate 103. Furthermore, the accessed memory cell sends an inverted version of the stored information signal to the bit line 22 via the transmission gate 104. If a logic "1" word signal is not supplied to any of the memory cells 100(1)-(m) (that is, a logic "0" signal is supplied to all the memory cells 100(1)-(m)), a precharge circuit (not shown) is activated. This precharge circuit forcefully charges the bit lines 21 and 22 to a logic "1" state.

A FF (flipflop) 30 formed of gates 31 and 32 rapidly determines the read result in accordance with the logic value of a pair of signal lines, such as the afore-mentioned bit lines 21 and 22. When the signal logic state on the bit line 21 is a logic "1" and the logic state on the bit line 22 is a logic "0", the FF 30 supplies a logic "0" information signal to the data bus driver 40 in response thereto. When the signal logic state on the bit line 21 is a logic "0" and the signal logic state on the bit line 22 is a logic "1", the FF 30 supplies a logic "1" information signal to the data bus driver 40 in response thereto. When the bit lines 21 and 22 are both in the logic "1" state due to the afore-described precharge circuit operation, the logic state of the information signal supplied to the data bus driver 40 prior to that state is held, while it is supplied to the data bus driver 40.

An exclusive-OR, EXNOR, gate 50 supplies a logic "1" signal to the gate 60 when the signal logic values on the bit lines 21 and 22 are the same, whereas it supplies a logic "0" information sense signal to the gate 60 when the signal logic values on the bit lines 21 and 22 are different from each other. That is, when the signal logic values on the bit lines 21 and 22 are different from each other, the EXNOR gate 50 determines that the information signal has been sent from the memory cell 100 onto the bit lines 21 and 22, and then outputs a logic "0" information sense signal.

While the logic "0" information sense signal is supplied from the EXNOR gate 50, the gate 60 supplies a logic "1" memory read instruction signal to the output control terminal b of the data bus driver 40 and to the inverter 41 only when a logic "0" memory read instructions signal is supplied from a control means, such as a central processing unit (not shown). The inverter 41 supplies an inverted version of that output signal of the gate 60 to the inverting output control terminal a of the data bus driver 40.

So configured, the data bus driver 40 is rendered into an output enable state only when a logic "1" memory read instruction signal is supplied from the gate 60, and generates a voltage corresponding to the logic value of the information signal stored in the FF 30 and applies it to the data signal bus DB0. Also, the data bus driver 40 is rendered into an output disable state when a logic "0" signal is supplied from the gate 60. Thus, the data signal bus DB0 is rendered into a so-called high-impedance state. That is, when the logic values of the signals on the bit lines 21 and 22 are the same, the data bus driver 40 will not be rendered into the output enable state even if the logic "0" memory read instruction signal is supplied thereto.

FIG. 4 shows one example of timing chart for reading data stored in the SRAM so configured.

It is assumed here that the memory cell 100 prestores a logic "0" information signal and the FF 30 stores a logic "0" information signal a as an initial value and outputs it as appropriate.

In FIG. 4, because the word select signal is first in a logic "0" state, the bit line 21 (denoted by a solid line) and bit line 22 (denoted by a dotted line) are both in a logic "1" state, due to the operation of the afore-described precharge circuit. Thus, the EXNOR gate 50 supplies a logic "1" signal to the gate 60. Therefore, the gate 60 outputs a logic "0" signal, so that the data signal bus DB0 is in the high-impedance state Z.

Next, when the word select signal becomes a logic "1", the logic "0" information signal stored in the memory cell 100 is sent onto the bit line 21 in response thereto. Also, to the bit line 22 is sent a logic "1" signal, or an inverted version of that information signal. Then, until the information signal stored in the memory cell 100 is sent onto the bit lines 21 and 22 from a transition point where the word select signal is rendered into a logic "1", a delay is introduced as shown in FIG. 4, due to the influence of component capacitance, length of wiring and the like. After such delay, when the information signal and its inverted information signal are sent onto the bit lines 21 and 22, respectively, the logic values on the bit lines 21 and 22 become "0" and "1", respectively. Then, the EXNOR gate 50 supplies a logic "0" information sense signal to the gate 60. The FF 30 outputs a logic "1" information signal b in response to the logic "0" and "1" states on the bit lines 21 and 22.

Now, concurrent with the afore-described transition of the word select signal to a logic "1" state, a logic "0" memory read instruction signal is supplied to the gate 60. However, because the EXNOR gate. 50 supplies the logic "1" signal to the gate 60 until it is determined that the information signal stored in the memory cell 100 has been sent onto the bit lines 21 and 22, the data bus driver 40 will not be rendered into the output enable state during that time, even if a logic "0" memory read instruction signal is supplied to the gate 60.

Thus, even if the information signal a as shown in FIG. 4 has been supplied to the data bus driver 40 at the start of the supply of the memory read instruction signal due to the aforementioned delay, this information signal a is not sent onto the data signal bus DB0, but only the information signal b read from the memory cell 100 is sent onto the data signal bus DB0.

Thus, as is apparent from the above description, the low power consumption semiconductor memory device according to the present invention detects when the information signal is placed onto the bit lines in accordance with the logic states on a pair of bit lines on which the information signal stored in the memory cell and an inverted version of that information signal are placed, and reads the information signal on the bit lines onto the data signal bus.

Thus, according to the present invention, after it is detected that the information signal from the memory cell is sent onto the bit line as a stored information leader line, that information signal is read onto the data signal bus. Therefore, even when rapid reading is implemented by making the timing to send the information signal stored in the memory cell onto the bit line coincide with the timing to supply the memory read instruction signal for reading the information signal on that bit line onto the data bus, only that information signal is reliably read onto the data bus, so that the wasteful consumption of power due to reading extra signals onto the data bus can be advantageously minimized.

I claim:

1. A low power consumption semiconductor memory device comprising:

a memory cell where an information signal is stored;

a pair of bit lines on which the information signal stored in said memory cell and an inverted version of said information signal are placed;

an information signal sense means for detecting when said information signal is placed onto said bit line in accordance with the exclusive-OR logic value of each of said bit lines and generating an information sense signal; and an information signal reading means, responsive to said information sense signal, for reading said information signal on said bit line onto a data signal bus.

2. A low power consumption semiconductor memory device according to claim 1, further comprising: an address decoder for generating a word select signal corresponding to an address signal, wherein said memory cell sends said information signal and said inverted information signal to each of said bit lines in response to said word select signal.

3. A low power consumption semiconductor memory device according to claim 1,,wherein said information signal sense means generates said information sense signal when said bit lines have different logic values.

4. A low power consumption semiconductor memory device according to claim 1, wherein said information signal reading means comprises a gate means for generating a memory read signal in response to a memory read instruction signal and said information sense signal, and a data bus driver for reading the information signal on said bit line onto a data signal bus in response to said memory read signal.

\* \* \* \* \*